United States Patent
Danz

(10) Patent No.: US 10,809,296 B2
(45) Date of Patent: Oct. 20, 2020

(54) OVER-THE-AIR TEST SYSTEM AND METHOD FOR TESTING A DEVICE UNDER TEST

(71) Applicant: Rohde & Schwarz GmbH & Co. KG, Munich (DE)

(72) Inventor: Joachim Danz, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 245 days.

(21) Appl. No.: 15/825,018

(22) Filed: Nov. 28, 2017

(65) Prior Publication Data
US 2019/0162780 A1 May 30, 2019

(51) Int. Cl.
| | |
|---|---|
| *G01R 31/302* | (2006.01) |
| *G01R 31/307* | (2006.01) |
| *G01R 31/317* | (2006.01) |
| *G01R 31/28* | (2006.01) |
| *H04B 17/29* | (2015.01) |

(52) U.S. Cl.
CPC ..... *G01R 31/3025* (2013.01); *G01R 31/2841* (2013.01); *G01R 31/307* (2013.01); *G01R 31/317* (2013.01); *H04B 17/29* (2015.01)

(58) Field of Classification Search
CPC .. H04B 17/29; G01R 31/3025; G01R 31/307; G01R 31/317; G01R 31/2841
See application file for complete search history.

(56) References Cited

U.S. PATENT DOCUMENTS

| | | | |
|---|---|---|---|
| 8,103,470 B2 | 1/2012 | Teshirogi et al. | |
| 2010/0285753 A1* | 11/2010 | Foegelle | H04B 17/21 455/67.12 |
| 2011/0032162 A1* | 2/2011 | Li | G01R 29/105 343/703 |
| 2011/0133999 A1* | 6/2011 | Cho | G01R 29/0821 343/703 |
| 2012/0306521 A1* | 12/2012 | Nickel | G01R 31/3025 324/754.03 |
| 2016/0216371 A1* | 7/2016 | Ahmed | G01V 8/005 |

FOREIGN PATENT DOCUMENTS

| | | |
|---|---|---|
| EP | 3182144 A1 | 6/2017 |
| JP | 2013021579 A | 1/2013 |

\* cited by examiner

*Primary Examiner* — Regis J Betsch
*Assistant Examiner* — Jeremy A Delozier
(74) *Attorney, Agent, or Firm* — Christensen O'Connor Johnson Kindness PLLC

(57) ABSTRACT

An over-the-air test system is described that is used for testing a device under test in a wireless communication environment. The test system comprises at least one measurement antenna connected with a signal processing unit configured to generate a signal or to analyze a signal. The test system further comprises a reflector configured to reflect electromagnetic signals, the reflector being positioned in a signal path established between the device under test and the measurement antenna such that the signals are reflected by the reflector. The measurement antenna has a radiation pattern with a main lobe, the measurement antenna being configured to adjust the direction of the main lobe with respect to the reflector in order to simulate different impinging angles of the signals. Further, a method for testing a device under test is described.

18 Claims, 2 Drawing Sheets

OVER-THE-AIR TEST SYSTEM AND METHOD FOR TESTING A DEVICE UNDER TEST

FIELD OF THE DISCLOSURE

Embodiments of the present disclosure relate generally to an over-the-air test system for testing a device under test in a wireless communication environment. Further, embodiments of the present disclosure relate to a method for testing a device under test with an over-the-air test system for testing a device under test in a wireless communication environment.

BACKGROUND

Over-the-air test systems for testing communication devices are known, for instance for testing mobile communication devices such as mobile phones or tablets. These communication devices to be tested correspond to devices under test wherein the communication properties of the devices under test are evaluated by the test system appropriately, in particular the transmission and/or receiving properties of the communication devices.

It is known to investigate the transmission properties of the device under test by transmitting test signals via the device under test, which are received by a stationary measuring antenna of the test system under different impinging angles. Typically, the device under test as well as the stationary measuring antenna are located in an anechoic chamber wherein the device under test is controlled such that signals are transmitted in different directions in order to simulate the different impinging angles. For instance, the device under test is located on a turntable which rotates such that the device under test also rotates. Hence, the signals to be received by the measurement antenna are transmitted in different directions due to the rotation of the device under test.

For analyzing the receiving characteristics of the device under test, a complex test system has to be used in order to simulate several different base stations that transmit signals to be received by the device under test, which are received under different impinging angles. Due to the complex test system, the costs for determining the receiving properties of the device under test are high.

SUMMARY

Accordingly, there is a need for a test system as well as a method for testing a device under test in a wireless communication environment that ensure testing the transmission properties and the receiving properties of a device under test in a simple and cost-efficient manner.

Embodiments of the present disclosure provide an over-the-air test system for testing a device under test in a wireless communication environment. The test system comprises at least one measurement antenna connected with a signal processing unit configured to generate a signal or to analyze a signal. The test system further comprises a reflector configured to reflect electromagnetic signals wherein the reflector is positioned in a signal path established between the device under test and the measurement antenna such that the signals are reflected by the reflector. The measurement antenna has a radiation pattern with a main lobe, the measurement antenna being configured to adjust the direction of the main lobe with respect to the reflector in order to simulate different impinging angles of the signals.

Further, embodiments of the present disclosure provide a method for testing a device under test with an over-the-air test system for testing a device under test in a wireless communication environment, comprising the following steps:
providing a device under test;
providing a signal processing unit connected to a measurement antenna having a radiation pattern with a main lobe;
providing a reflector that is positioned in a signal path between the device under test and the measurement antenna;
transmitting a first signal via the device under test or the measurement antenna, the first signal being reflected by the reflector;
receiving the first signal transmitted by the measurement antenna or the device under test under a first incident angle;
controlling the measurement antenna such that the direction of the main lobe is varied;
transmitting a second signal via the device under test or the measurement antenna, the second signal being reflected by the reflector; and
receiving the second signal transmitted by the measurement antenna or the device under test under a second incident angle.

Accordingly, an over-the-air (OTA) test system as well as a method for testing a device under test in a wireless communication environment are provided which enable to test the receiving properties of the device under test in a simple and cost-efficient manner as different impinging angles of the signals can be tested easily. The impinging angles correspond to the angles of arrival of the signals at the respective receiving unit wherein the receiving unit may be provided by the device under test or the measurement antenna depending on the test scenario applied. The direction of the main lobe of the measurement antenna is varied such that the transmitting direction or the receiving direction of the measurement antenna is adjusted appropriately. For instance, the signals transmitted via the measurement antenna arrive at the device under test under different impinging angles when changing the direction of the main lobe. The impinging angles correspond to incident angles at the device under test. Thus, different base stations can be simulated easily that transmit signals towards the device under test from different directions by varying the direction of the main lobe, for example, by controlling the radiation pattern of the measurement antenna.

Generally, the transmission properties and/or the receiving properties of the measurement antenna are varied by changing the direction of the main lobe since the measurement antenna substantially transmits and receives a signal via the main lobe of the radiation pattern, respectively. Thus, the over-the-air test system and the method are used for testing the receiving properties and/or the transmission properties of the device under test.

The measurement antenna can be used to simulate the counterpart of an established communication with regard to the device under test, namely a base station. Usually, a communication device (used as the device under test) establishes a communication link with a base station wherein signals are exchanged in a bidirectional manner.

According to an aspect, the signal processing unit is at least one of a signal generating unit and a signal analyzing unit. Thus, the signal processing unit that is connected with the measurement antenna is configured to generate a signal to be transmitted via the measurement antenna. Alternatively, the signal processing unit may be a signal analyzing unit that receives and analyses a signal generated by the device under test. Therefore, the test system may be used to test the transmission properties or the receiving properties of the device under test solely.

According to another aspect, the signal processing unit comprises a signal generating sub-unit and a signal analyzing sub-unit such that the signal processing unit is configured to receive a signal from the device under test and to transmit a signal towards the device under test. Thus, the single signal processing unit can be used to test the transmission properties of the device under test as well as the receiving properties of the device under test. Accordingly, a single test system can be used for testing the overall communication properties of the device under test, in particular to test its behavior with regard to different base stations simulated as the different impinging angles or rather incident angles may correspond to different base stations as already mentioned.

The measurement antenna may be positioned stationary, the measurement antenna having moveable hardware components for varying the direction of the main lobe. Thus, the measurement antenna can be controlled in a mechanic manner for changing the direction of the main lobe. This means that at least a part of the measurement antenna rotates about a rotation axis upon receiving corresponding control signals, for example the moveable hardware components. The radiation pattern, and in some embodiments the direction of the main lobe, is varied due to the rotation of the moveable hardware components. Hence, the receiving direction and/or the transmission direction of the measurement antenna is adjustable.

According to another embodiment, the measurement antenna comprises a beam steering unit. In this embodiment, the measurement antenna may be stationary positioned wherein the hardware components are also stationary. Hence, no mechanical movement is necessary as the measurement antenna, for example its beam steering unit, is controlled electronically in order to vary the direction of the main lobe. This can be achieved by using a phased array antenna as the measurement antenna which comprises several antenna elements that can be controlled independently.

The measurement antenna may be positioned stationary which means that its location is fixed with respect to a testing location at which the device under test is located during the testing. The movable components of the measurement antenna only provide a relative movement of the respective hardware components for setting the direction of the main lobe wherein the relative position of the measurement antenna with respect to the device under test is maintained.

Alternatively or supplementarily, the measurement antenna is controlled electrically, in particular the phased array antenna used as the measurement antenna.

Furthermore, the reflector may be located in a certain position assigned to at least one of the device under test and the measurement antenna. Thus, a small reflector is sufficient for reflecting the signals to be exchanged in the desired manner. The reflector redirects or rather deflects the signals exchanged. For instance, a first reflector may be assigned to the device under test whereas a second reflector is assigned to the measurement antenna. Both reflectors ensure that different impinging angles or rather incident angles can be used for testing the transmission properties and the receiving properties of the device under test.

According to another aspect, the reflector has a continuous reflecting surface facing the device under test and the measurement antenna. Accordingly, a single reflector is assigned to the device under test and the measurement antenna simultaneously. Thus, a single reflector can be used for testing the transmission properties as well as the receiving properties of the device under test as this single reflector redirects the signals transmitted by the device under test and the signals transmitted by the measurement antenna.

Another aspect provides that the test system comprises a signal attenuation unit. The signal attenuation unit may ensure that interfering and/or disturbing signals are suppressed appropriately. Alternatively or supplementarily, the signal attenuation unit attenuates the signals exchanged in order to improve the analyses performed by reducing the power of the signals received by the respective receiving unit.

For instance, the signal attenuation unit is located at least in one of the signal path and the line of sight between the device under test and the measurement antenna. The signal attenuation unit located in the signal path ensures that the signals are attenuated which are exchanged between the device under test and the measurement antenna.

Alternatively or supplementarily, the signal attenuation unit located in the line of sight ensures that no direct signal exchange occurs between the device under test and the measurement antenna. Thus, all signals are exchanged via the reflector ensuring that the testing of the device under test can be carried out in a defined manner, for example with regard to the impinging or incident angle of the signals.

Generally, the line of sight between the device under test and the measurement antenna corresponds to the straight line between both units.

According to a certain embodiment, the signal attenuation unit is provided by at least one of the surface of the reflector and a separately formed attenuation unit. For instance, the surface of the reflector may be covered with an attenuation coating such that the signals running along the signal path are attenuated, for example by the reflector itself, namely its reflecting surface being coated appropriately.

The separately formed attenuation unit may be located between the device under test and the measurement antenna, for example in the line of sight or rather the straight line between the device under test and the measurement antenna.

According to a certain embodiment, the reflector has at least partially an elliptic shape. The elliptic shape ensures that the signals are redirected or rather deflected in a defined manner, for example towards the corresponding receiving unit. As already mentioned above, the receiving unit may be the device under test or the measurement antenna depending on the testing scenario applied, namely testing the receiving properties of the device under test or the transmission properties of the device under test.

Further, a testing location for the device under test and the measurement antenna may be assigned to two focal points of the elliptically shaped reflector. This ensures that the signals may be exchanged between the device under test and the measurement antenna under many different incident angles as the signals transmitted are always reflected towards the respective receiving unit.

Another aspect provides that the measurement antenna comprises a shielding member, the shielding member being assigned to the measurement antenna in order to shield the radiation pattern of the measurement antenna apart from the main lobe. The active radiation pattern of the measurement antenna is limited to its main lobe. This ensures that no interfering or disturbing signals are provided which may originate from side lobes of the radiation pattern. In other words, the radiation characteristics of the measurement antenna are well defined since only the main lobe of the measurement antenna is used for receiving and/or transmitting signals. In general, this results in a sharp-directional antenna having negligible side lobes.

A device under test may be provided wherein the device under test is configured to transmit signals in different directions and/or to receive signals from different directions. Accordingly, the receiving properties as well as the transmission properties of the device under test can be tested by the single test system in a cost efficient, easy and efficient manner.

The device under test may be located stationary during the different tests applied since the measurement antenna, used as the counterpart of the communication link to be established, is adapted for testing the properties of the device under test.

According to an aspect, the signals are received in the far field of at least one of the measurement antenna and the device under test. The reflector ensures that a compact test system is provided even though the far field properties of the device under test are tested, in particular the receiving properties and/or the receiving properties in the far field. Thus, the device under test can be tested under real application conditions.

Moreover, several signals may be exchanged, each signal having a different incident angle. Each signal corresponds to the simulation of a certain base station. Thus, different base stations can be simulated by the test system wherein the base stations simulated receive and/or transmit signals from different directions in order to ensure that the device under test can be tested under real conditions.

Another aspect provides that the signals contain different data. The different data typically correspond to the simulation of different base stations as each base station transmits different data. Accordingly, different base stations can be simulated wherein the different base stations can be distinguished easily due to the different data used.

The signals may be transmitted simultaneously as the different signals can be distinguished from each other due to the different data of the signals.

Another aspect provides that the signals are transmitted temporally delayed. Accordingly, the signals are exchanged in a subsequent manner ensuring that no interfering or other disturbing effects may influence the testing of the device under test.

In general, the test system as well as the method enable to test the connection (communication link) between the device under test and the simulated counterpart by controlling the measurement antenna appropriately. Due to the different incident angles of the signals, the connections in many different directions can be tested, for example in a bidirectional manner representing the real application of the device under test.

In some embodiments, the measurement antenna used is a directional antenna.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
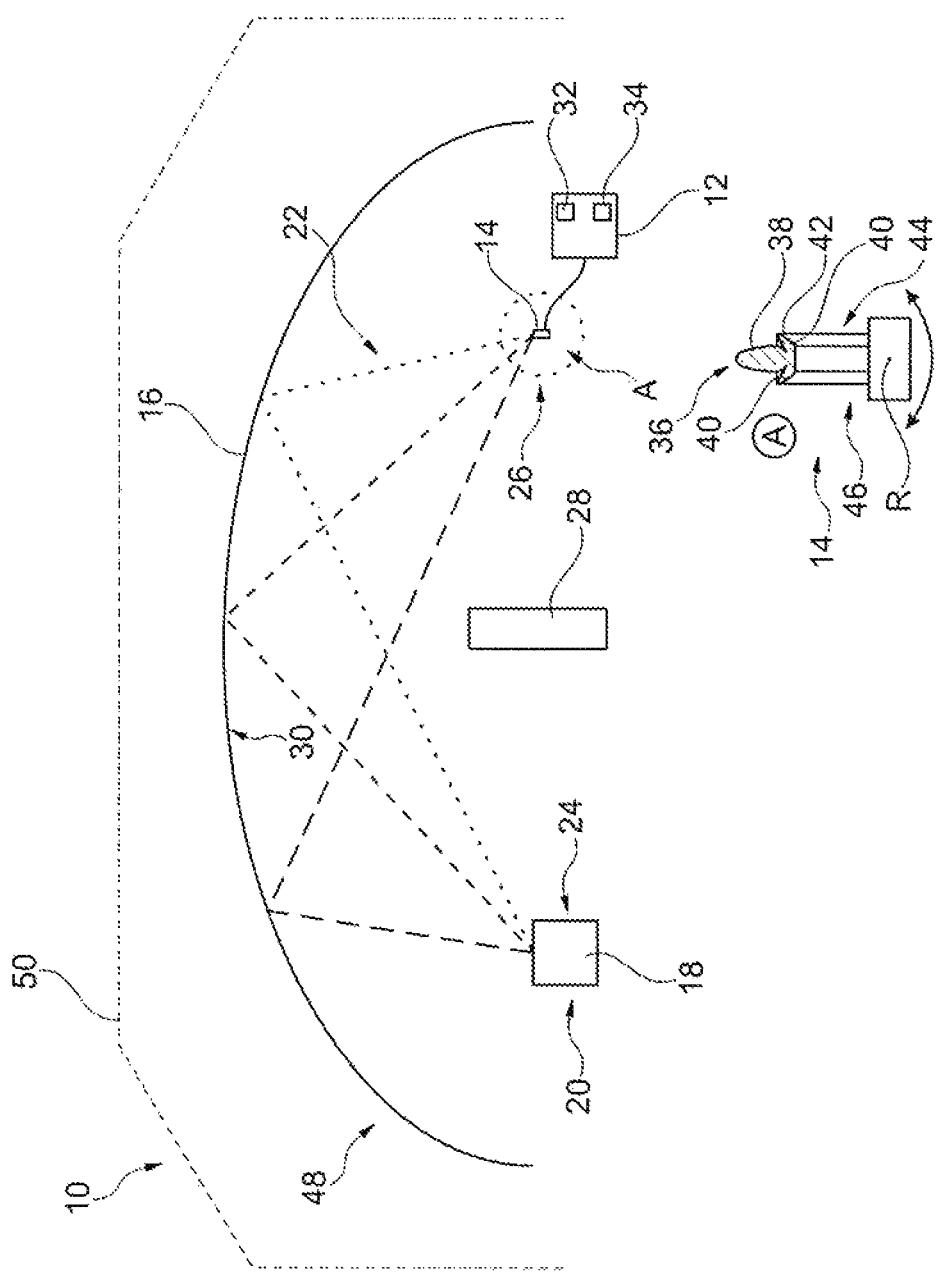
FIG. 1 shows a schematic overview of one representative embodiment of a test system according to the present disclosure.

In FIG. 1, an over-the-air (OTA) test system 10 is shown that comprises a signal processing unit 12 that is connected with a measurement antenna 14 which receives and/or transmits a signal. Therefore, the signal processing unit 12 is configured to analyze a signal received via the measurement antenna 14 and/or to generate a signal to be transmitted via the measurement antenna 14.

Further, the test system 10 comprises a reflector 16 for reflecting electromagnetic signals that are used for testing purposes. The reflector 16 is positioned between the measurement antenna 14 and a device under test 18 to be tested which is positioned at a testing location 20 of the test system 10. In fact, the testing location 20 corresponds to a fixed location with respect to the reflector 16. Accordingly, a signal path 22 is established between the device under test 18 and the measurement antenna 14 along which the signals are exchanged. The reflector 16 is positioned in the signal path 22 for reflecting the signals appropriately such that it is ensured that the signals impinge on the respective receiving unit under a defined angle. The receiving unit may be the measurement antenna 14 or the device under test 18 depending on the testing scenario applied.

For instance, a signal is generated by the signal processing unit 12 and forwarded to the measurement antenna 14. The measurement antenna 14 transmits the signal generated via the measurement antenna 14 which impinges on the reflector 16 such that the signal is reflected towards the device under test 18 at a defined impinging angle or incident angle.

In a similar manner, a signal transmitted via the device under test 18 impinges on the reflector 16 such that the signal is reflected towards the measurement antenna 14 at a defined impinging angle or incident angle wherein the signal received by the measurement antenna 14 is forwarded to the signal processing unit 12 for analyzing purposes.

In the shown embodiment, the reflector 16 has at least partially an elliptic shape such that the testing location 20, for example the device under test 18 located at the testing position 20, as well as the measurement antenna 14 are located at two focal points 24, 26 of the elliptically shaped reflector 16. However, the reflector 16 may also have another shape ensuring that the signals transmitted are reflected towards the respective receiving unit in a defined manner.

Generally, it is ensured that the signals transmitted by the transmitting unit, namely the device under test 18 or the measurement antenna 14, are always directed towards the receiving unit, namely the measurement antenna 14 or the device under test 18, even though the signals are transmitted via different angles. This may be ensured due to the fact that the reflector 16 is elliptically shaped and the measurement antenna 14 as well as the device under test 18 are located in the focal points 24, 26 of the elliptically shaped reflector 16.

In the shown embodiment, the reflective surface of the reflector 16 is formed continuously such that the reflective surface faces both the device under test 18 and the measurement antenna 14. Alternatively, several reflectors are provided each being assigned to a specific area of the device under test 18 and the measurement antenna 14. For instance, a first reflector is assigned to an angle area of 0° to 20° wherein a second reflector is assigned to an angle area of 40° to 60° and so on.

Generally, the at least one reflector 16 is assigned to at least one of the device under test 18 and the measurement antenna 14.

As already shown in FIG. 1, several signal paths 22 (illustrated by the dashed lines) can be established between the device under test 18 and the measurement antenna 14 wherein the different signal paths 22 are assigned to different angle areas as will be explained later with regard to FIG. 2.

Moreover, the test system 10 comprises at least one signal attenuation unit 28 which is located in the line of sight between said device under test 18 and the measurement antenna 14 in order to suppress any direct signal transmission between the device under test 18 and the measurement antenna 14 without reflectance via the reflector 16. Accordingly, the signals to be received are always reflected by the reflector 16 previously ensuring a defined incident angle. Hence, only defined signal paths 22 between the device under test 18 and the measurement antenna 14 are provided. As shown in FIG. 1, the attenuation unit 28 is formed separately wherein it is located in the straight line between said device under test 18 and the measurement antenna 14.

Moreover, the test system 10 may comprise another signal attenuation unit 30 which is provided as a coating on the reflective surface of the reflector 16 for attenuating the signals exchanged via the signal paths 22. For instance, the power of the signals are attenuated appropriately by the coating.

As already mentioned, the signal processing unit 12 is configured to analyze the signals received via the measurement antenna 14 as well as to generate signals to be transmitted via the measurement antenna 14. For these purposes, the signal processing unit 12 comprises a signal generating sub-unit 32 as well as a signal analyzing sub-unit 34 in the shown embodiment. Such signal generating sub-unit 32 as well as a signal analyzing sub-unit 34 may include logic implemented in hardware, software, or a combination of hardware and software.

Alternatively, the signal processing unit 12 may be a signal generating unit or a signal analyzing unit such that the signal processing unit 12 is configured to solely generate a signal or to only analyze a signal received. The signal processing unit 12 may include logic implemented in hardware, software, or a combination of hardware and software.

As already mentioned above, the test system 10, and in some embodiments the measurement antenna 14, can be used for establishing different signal paths 22 between the device under test 18 and the measurement antenna 14. For this purpose, the measurement antenna 14, which is shown in more detail in the zoomed portion of FIG. 1 indicated by A, has a radiation pattern 36 that comprises a main lobe 38 and side lobes 40 as revealed by the zoomed portion A.

The main lobe 38 defines the radiation characteristics of the measurement antenna 14 which means that signals are substantially transmitted by the measurement antenna 14 via the main lobe 38. In a similar manner, the measurement antenna 14 substantially receives signals only via the main lobe 38. Therefore, the main lobe 38 of the radiation pattern 36 defines the receiving properties as well as the transmitting properties of the measurement antenna 14 in general.

In the shown embodiment, the usable or rather active radiation pattern 36 mainly consists of the main lobe 38 as a shielding member 42 is provided which shields the radiation pattern 36 partly, for example, the side lobes 40.

This ensures that no disturbing or interfering signals are transmitted or received via the side lobes 40 of the measurement antenna 14. In fact, a sharp-directed antenna is provided due to the shielding member 42.

Generally, the measurement antenna 14 may be established by a directional antenna having no or reduced side lobes. Nevertheless, the directional antenna may also comprise a shielding member 42 for further reducing the impact of the side lobes or rather improving its directional characteristics.

In addition, the measurement antenna 14 is generally configured to vary the direction of the main lobe 38, for example with respect to the reflector 16, such that the signals exchanged can impinge under different angles on the reflector 16. In fact, the different signal paths 22 can be established by changing the direction of the main lobe 38.

The measurement antenna 14 may be located stationary with regard to the reflector 16, for example, at the focal point 26, such that the position of the measurement antenna 14 is not changed for adapting the direction of the main lobe 38.

The variation of the direction of the main lobe 38 may be ensured by moveable hardware components 44 of the measurement antenna 14 that are controlled to change the direction of the main lobe 38 in a mechanical manner. For instance, the moveable hardware components 44 are rotated with respect to stationary hardware components of the measurement antenna 14 about a rotation axis R such that the direction of the main lobe 38 can be varied appropriately.

Alternatively or supplementarily, the measurement antenna 14 comprises only stationary hardware components which cannot be rotated or moved with respect to each other. In this embodiment, the measurement antenna 14 may have a beam steering unit 46. The beam steering unit 46 enables to vary the direction of the main lobe 38 in an electric manner.

For instance, the measurement antenna 14 is established by a phased-array antenna which may be controlled electrically in order to adapt the direction of the main lobe 38 appropriately. In some embodiments, the measurement antenna 14 is a phased-array antenna having directional characteristics.

In general, the test system 10 may comprise an anechoic chamber 48 which may be encompassed by a shielding box 50. Thus, the wireless communication environment for testing the device under test 18 is provided. The components of the test system 10, for example, the measurement device 18, the reflector 16 and the measurement antenna 14, are located within the anechoic chamber 48 wherein environmental influences are shielded by the shielding box 50, in particular the respective housing.

Figure 2:
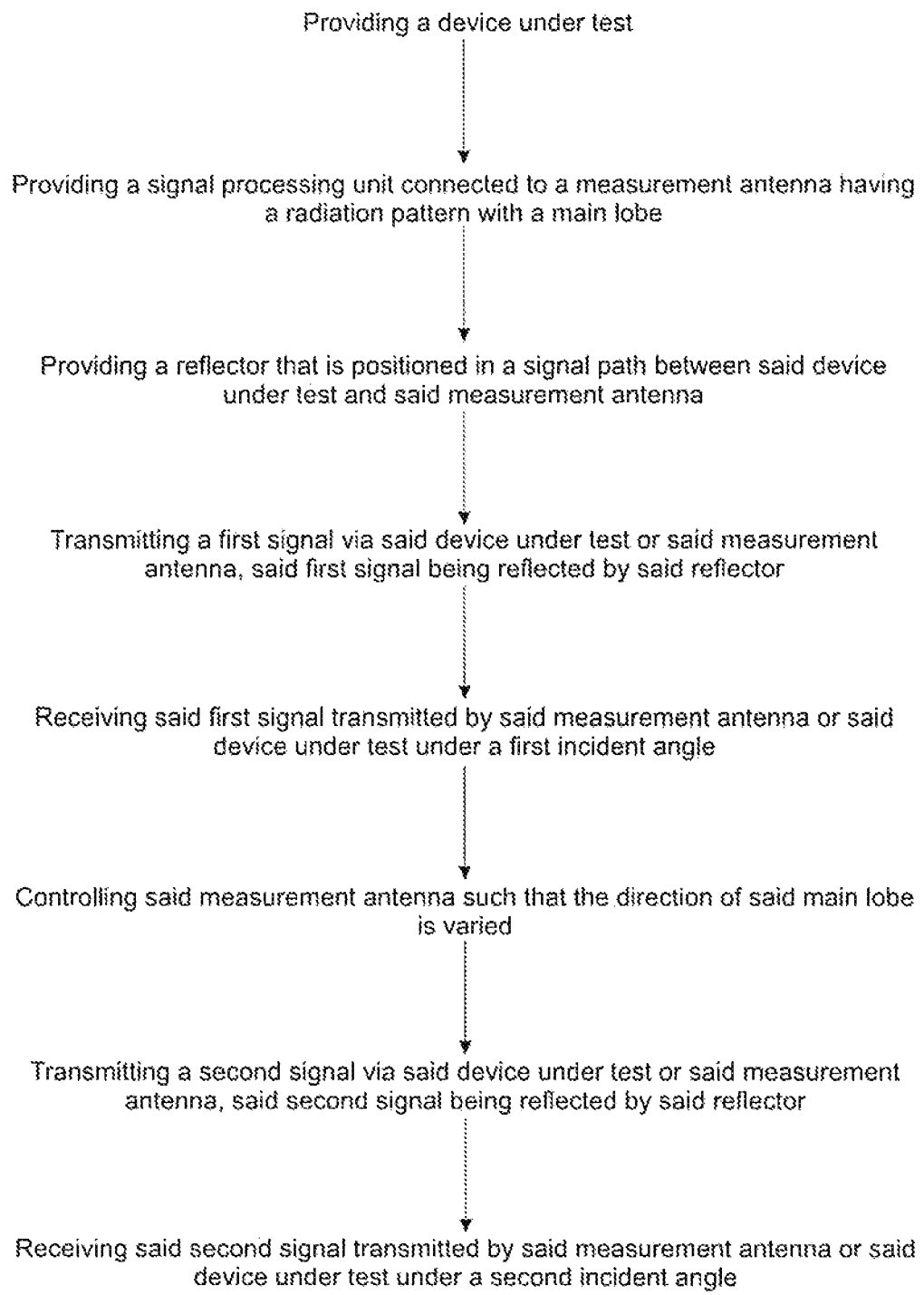
FIG. 2 shows a schematic overview representing an embodiment of a method according to the present disclosure.

In FIG. 2, an embodiment of a method for testing the device under test 18 according to the present disclosure is shown. For instance, the test system 10 shown in FIG. 1 has to be established at the beginning. Hence, the device under test 18, the reflector 16, the measurement antenna 14 and the signal processing unit 12 are provided wherein the device under test 18 as well as the measurement antenna 14 are positioned in the focal points 24, 26 of the elliptically shaped reflector 16.

After the setup of the test system 10, the test procedure may begin. Accordingly, a first signal is transmitted via the device under test 18 or the measurement antenna 14, namely the respective unit used as the transmitting unit, wherein the first signal is reflected by the reflector 16. The first signal reflected is received by the appropriate receiving unit under a first incident angle, namely the measurement antenna 14 or the device under test 18. Thus, the receiving properties and/or the transmission properties of the device under test 18 can be determined.

In general, the measurement antenna 14 (together with the signal processing unit 12) corresponds to the counterpart of the device under test 18 with regard to the communication link simulated, in particular wherein the counterpart corresponds to a base station. Accordingly, a base station for the device under test 18 is simulated by the test system 10.

Depending on the signal direction, signals are transmitted from the base station simulated to the device under test 18 for testing the receiving properties of the device under test 18 or from the device under test 18 to the base station simulated for testing the transmission properties of the device under test 18.

Then, the measurement antenna 14 is controlled such that the direction of the main lobe 38 is varied. This means that the measurement antenna 14 is controlled in an electrical or a mechanical manner for changing the direction of the main lobe 38 appropriately as discussed above.

Then, a second signal is transmitted via the device under test 18 or the measurement antenna 14 wherein this second signal is reflected by the reflector 16 again.

It is ensured that the reflected second signal will be received by the appropriate receiving unit, namely the measurement antenna 14 or the device under test 20, under a second incident angle since the device under test 20 as well as the measurement antenna 14 are located at the focal points 34, 36 of the elliptically shaped reflector 16. However, other shapes also ensure that the signals can be exchanged under different angles as already discussed above.

The transmission properties or receiving properties of the device under test 18 can be investigated for a second simulated base station that receives or transmits signals from another direction with regard to the first simulated base station due to the different incident angles or rather impinging angles.

Accordingly, the incident angles of the signals impinging on the device under test 18 (receiving properties) can be varied by varying the direction of the main lobe 38. In a similar manner, the transmission properties of the device under test 18 can be tested for certain angle areas as the measurement antenna 14 only receives signals in the specific angle area corresponding to the direction of the main lobe 38.

Therefore, the transmitting properties as well as the receiving properties of the device under test 18 can be evaluated in an easy and cost efficient manner as only the measurement antenna 14, for example, the direction of the main lobe 38, has to be varied for testing purposes.

Generally, the signals are received in the far field of the device under test 18 and/or the measurement antenna 14 in order to ensure that the tests are carried out under real conditions. Even though the far field characteristics are tested, the whole test system 10 is a compact one.

Moreover, several signals may be exchanged wherein the signals have different incident angles in order to ensure that the properties of the device under test 18 are tested for many different base stations simulated.

As several base stations can be simulated by the test system 10, the multiple-in and multiple-out properties (MIMO characteristics) of the device under test 18 can be tested and evaluated by the test system 10 in an easy and cost-efficient manner.

The different signals may be transmitted temporally delayed, namely with different delays of time with respect to each other, such that it is ensured that the different signals do not interfere or disturb each other. This simplifies the evaluation of the respective properties of the device under test 18.

However, the signals may contain different data in order to ensure that they can be distinguished from each other easily. The different data contained in the signals transmitted also ensure that different base stations can be simulated in an appropriate manner.

Therefore, the signals may also be exchanged simultaneously as they can be distinguished from each other due to the different data provided.

The test system 10 or one or more components thereof may include, in some embodiments, logic for implementing the technologies and methodologies described herein. This logic of the test system can be carried out in either hardware or software, or a combination of hardware and software. In some embodiments, the test system 10 or one or more components thereof include one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the test system 10 or one or more components thereof include a microprocessor and a memory storing logic modules and/or instructions. In an embodiment, the test system 10 includes one or more ASICs having a plurality of predefined logic components. In an embodiment, the test system 10 or one or more components thereof include one or more FPGA having a plurality of programmable logic components. In an embodiment, the test system 10 or one or more components thereof include hardware circuit implementations (e.g., implementations in analog circuitry, implementations in digital circuitry, and the like, and combinations thereof). In an embodiment, the test system 10 or one or more components thereof include combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. An over-the-air test system for testing a device under test in a wireless communication environment, said test system comprising:
   at least one measurement antenna connected with a signal processing unit configured to generate a signal or to analyze a signal;
   a reflector configured to reflect electromagnetic signals, said reflector being positioned in a signal path established between said device under test and said measurement antenna such that the signals are reflected by the reflector, wherein said measurement antenna has a radiation pattern with a main lobe, said measurement antenna being configured to adjust the direction of said main lobe with respect to said reflector such that a transmitting direction or a receiving direction of said measurement antenna is adjusted in order to simulate different impinging angles of said signals, wherein said measurement antenna is positioned stationary, said measurement antenna having movable hardware components for varying the direction of said main lobe, variation of the direction of said main lobe is ensured by said movable hardware components that are controlled to change the direction of said main lobe in a mechanical manner.

2. The test system according to claim 1, wherein said signal processing unit is at least one of a signal generating unit and a signal analyzing unit.

3. The test system according to claim 1, wherein said signal processing unit comprises a signal generating sub-unit and a signal analyzing sub-unit such that said signal processing unit is configured to receive a signal from said device under test and to transmit a signal towards said device under test.

4. The test system according to claim 1, wherein said reflector is located in a certain position assigned to at least one of said device under test and said measurement antenna.

5. The test system according to claim 1, wherein said reflector has a continuous reflecting surface facing said device under test and said measurement antenna.

6. The test system according to claim 1, wherein said test system comprises a signal attenuation unit.

7. The test system according to claim 6, wherein said signal attenuation unit is located at least in one of said signal path and said line of sight between said device under test and said measurement antenna.

8. The test system according to claim 6, wherein said signal attenuation unit is provided by at least one of the surface of said reflector and a separately formed attenuation unit.

9. The test system according to claim 1, wherein said reflector has at least partially an elliptic shape.

10. The test system according to claim 9, wherein a testing location for said device under test and said measurement antenna are assigned to two focal points of said elliptically shaped reflector.

11. The test system according to claim 1, wherein said measurement antenna comprises a shielding member, said shielding member being assigned to said measurement antenna in order to shield the radiation pattern of said measurement antenna apart from said main lobe.

12. The test system according to claim 1, wherein a device under test is provided, said device under test being configured to transmit signals in different directions and/or to receive signals from different directions.

13. A method for testing a device under test with an over-the-air test system for testing a device under test in a wireless communication environment, comprising the following steps:

providing a device under test;

providing a signal processing unit connected to a measurement antenna having a radiation pattern with a main lobe;

providing a reflector that is positioned in a signal path between said device under test and said measurement antenna;

transmitting a first signal via said device under test or said measurement antenna, said first signal being reflected by said reflector;

receiving said first signal transmitted by said measurement antenna or said device under test under a first incident angle;

controlling said measurement antenna such that the direction of said main lobe is varied;

transmitting a second signal via said device under test or said measurement antenna, said second signal being reflected by said reflector; and receiving said second signal transmitted by said measurement antenna or said device under test under a second incident angle.

14. The method according to claim 13, wherein said signals are received in the far field of at least one of said measurement antenna and said device under test.

15. The method according to claim 13, wherein several signals are exchanged, each signal having a different incident angle.

16. The method according to claim 13, wherein said signals contain different data.

17. The method according to claim 13, wherein said signals are transmitted temporally delayed.

18. An over-the-air test system for testing a device under test in a wireless communication environment, said test system comprising:

at least one measurement antenna connected with a signal processing unit configured to generate a signal or to analyze a signal;

a reflector configured to reflect electromagnetic signals, said reflector being positioned in a signal path established between said device under test and said measurement antenna such that the signals are reflected by the reflector, wherein said measurement antenna has a radiation pattern with a main lobe, said measurement antenna being configured to adjust the direction of said main lobe with respect to said reflector such that a transmitting direction or a receiving direction of said measurement antenna is adjusted in order to simulate different impinging angles of said signals;

wherein said measurement antenna comprises a beam steering unit that is configured to vary the direction of said main lobe, said beam steering unit enabling to vary the direction of said main lobe in an electric manner.

* * * * *